US008043951B2

(12) United States Patent
Beugin et al.

(10) Patent No.: US 8,043,951 B2
(45) Date of Patent: Oct. 25, 2011

(54) METHOD OF MANUFACTURING A SEMICONDUCTOR DEVICE AND SEMICONDUCTOR DEVICE OBTAINABLE THEREWITH

(75) Inventors: Virginie Beugin, Goncelin (FR); Massud Abubaker Aminpur, Crolles (FR)

(73) Assignee: Freescale Semiconductor, Inc., Austin, TX (US)

( * ) Notice: Subject to any disclaimer, the term of this patent is extended or adjusted under 35 U.S.C. 154(b) by 109 days.

(21) Appl. No.: 12/670,502

(22) PCT Filed: Aug. 1, 2007

(86) PCT No.: PCT/IB2007/054859
§ 371 (c)(1),
(2), (4) Date: Jan. 25, 2010

(87) PCT Pub. No.: WO2009/016437
PCT Pub. Date: Feb. 5, 2009

(65) Prior Publication Data
US 2010/0227467 A1 Sep. 9, 2010

(51) Int. Cl.
*H01L 21/3205* (2006.01)
*H01L 21/4763* (2006.01)
(52) U.S. Cl. .. 438/593; 438/201; 438/258; 257/E21.209
(58) Field of Classification Search .................. 438/201, 438/257, 258, 264, 593; 257/314, 315, 318, 257/679, E21.209, E21.682; 365/185.04, 365/185.08
See application file for complete search history.

(56) References Cited

U.S. PATENT DOCUMENTS
5,514,889 A * 5/1996 Cho et al. .................. 257/316
(Continued)

FOREIGN PATENT DOCUMENTS
WO 00/38237 A 6/2000
WO 01/47012 A 6/2001

OTHER PUBLICATIONS

A. Birner et al: "A Fourth Material: Thermally Stable Organic Gap-Fill Spin-on-Polymer Enabling New Integration Concepts" Infineon Technologies, Dresden, Germany, IEEE, 2003, pp. 28.4.1-28.4.4.
Silk H: "Semiconductor Dielectric" SiLKnet Alliance, Dow, www.silknetalliance.com, www.silk.dow.com, www.dow.com.

(Continued)

*Primary Examiner* — Charles Garber
*Assistant Examiner* — Abdulfattah Mustapha

(57) ABSTRACT

A method of manufacturing a semiconductor device on a substrate. The method may include forming a non-volatile memory in a memory area of the substrate. The forming non-volatile memory on a substrate may include formation in the memory area of a floating gate structure and of a control gate structure which is in a stacked configuration with the floating gate structure. One or more gate material layer may be formed in a logic area of the substrate. After forming the control gate structure and the gate material layer, a filling material layer may be deposited over the logic area and the memory area. The filling material layer may be partially removed by reducing the thickness of the filling material in the logic area and the memory area, at least until a top surface of the one or more gate material layer is exposed. Logic devices may be formed in the logic area, the formation may include forming a logic gate structure from the gate material layer.

20 Claims, 9 Drawing Sheets

U.S. PATENT DOCUMENTS

| | | | |
|---|---|---|---|
| 5,643,813 | A | 7/1997 | Acocella |
| 5,899,713 | A | 5/1999 | Acocella et al. |
| 2005/0185446 | A1 | 8/2005 | Pividori |
| 2005/0189606 | A1 | 9/2005 | Nakagawa |
| 2005/0232008 | A1 * | 10/2005 | Shukuri et al. ............ 365/185.08 |

OTHER PUBLICATIONS

International Search Report and Written Opinion correlating to PCT/IB2007/054859 dated Apr. 25, 2008.

* cited by examiner

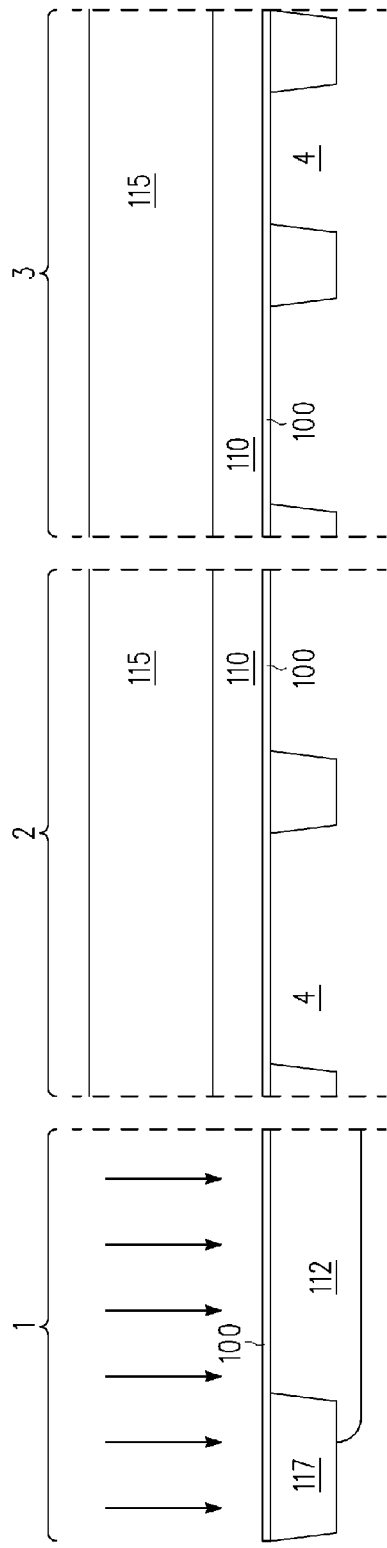
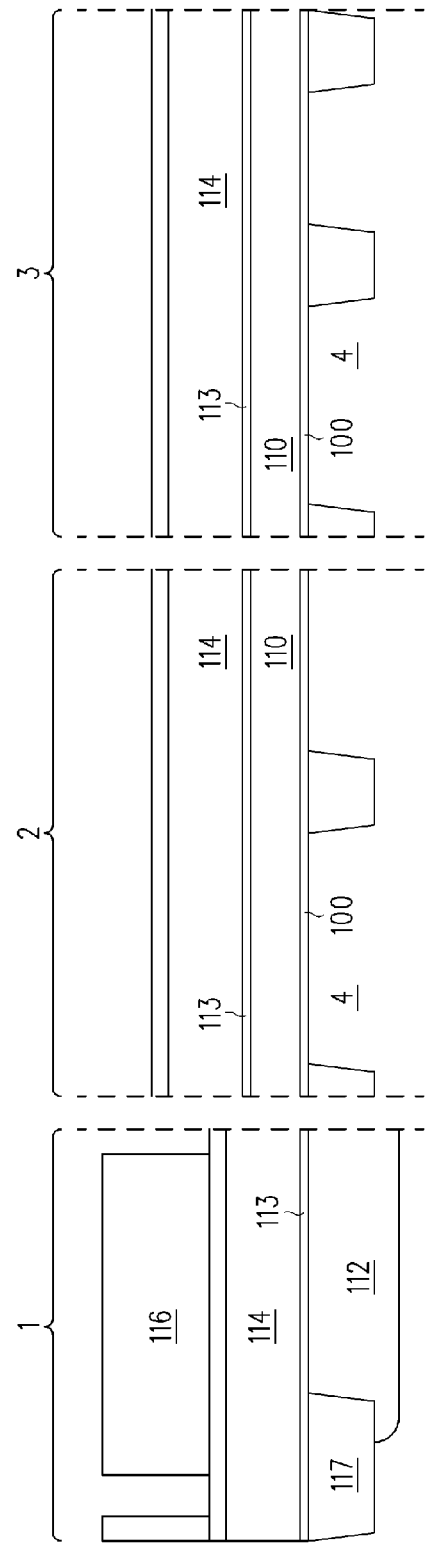
FIG. 1A
FIG. 1B

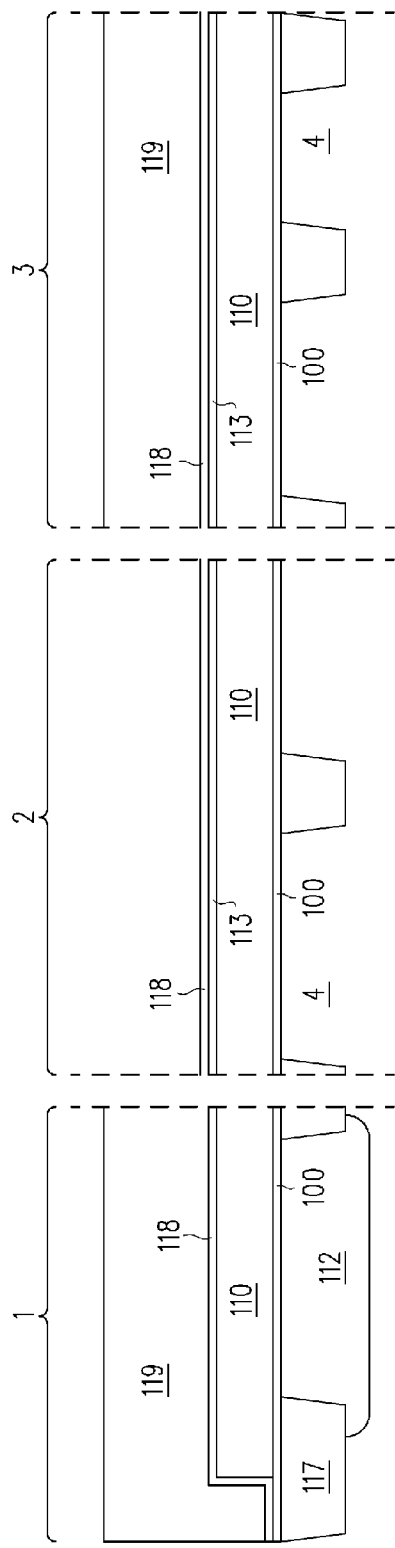
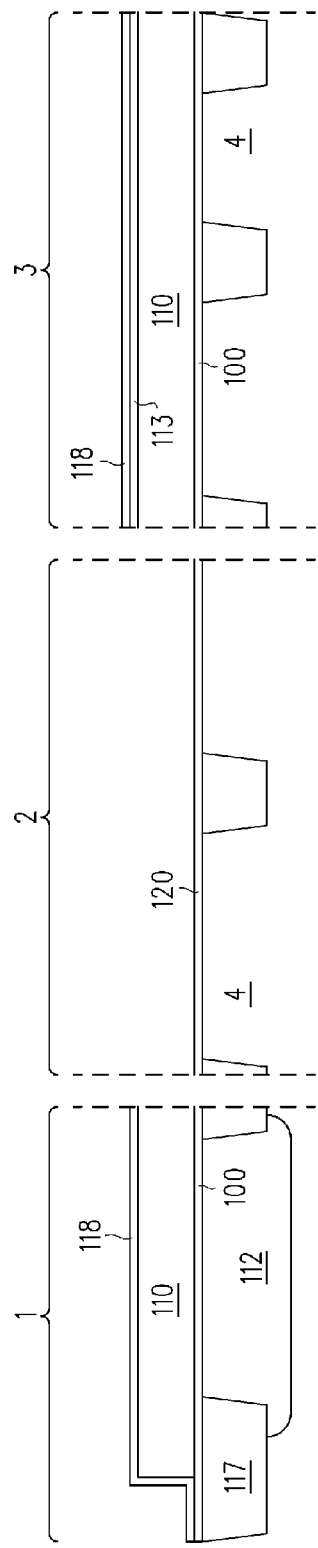

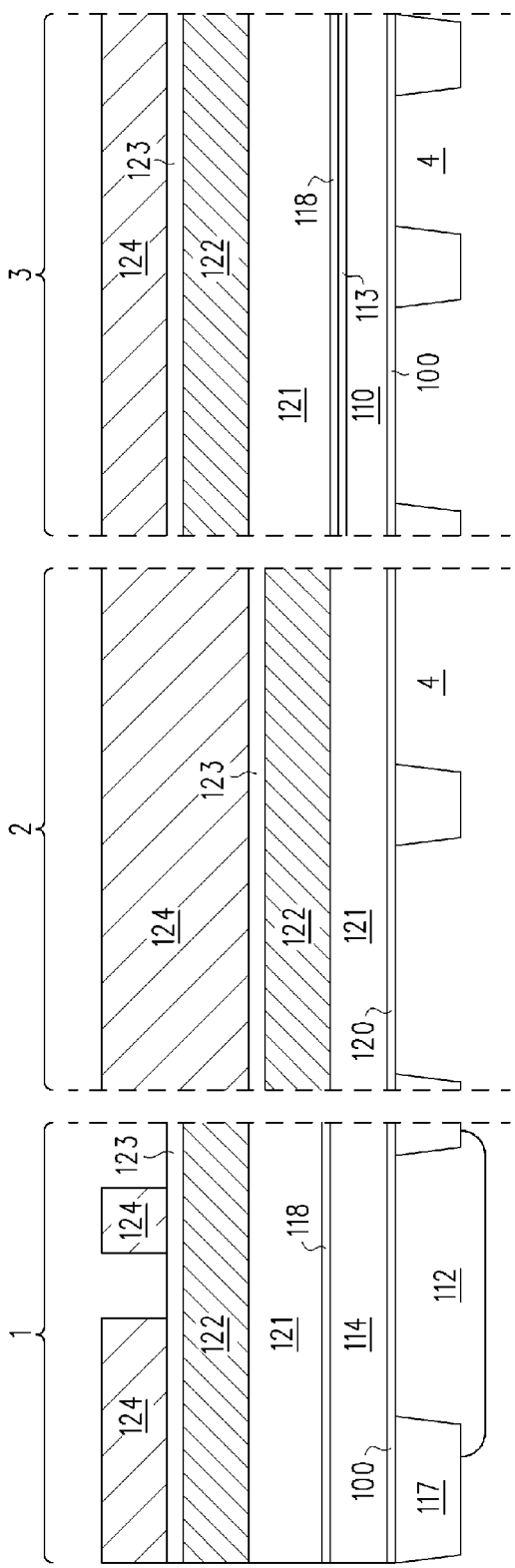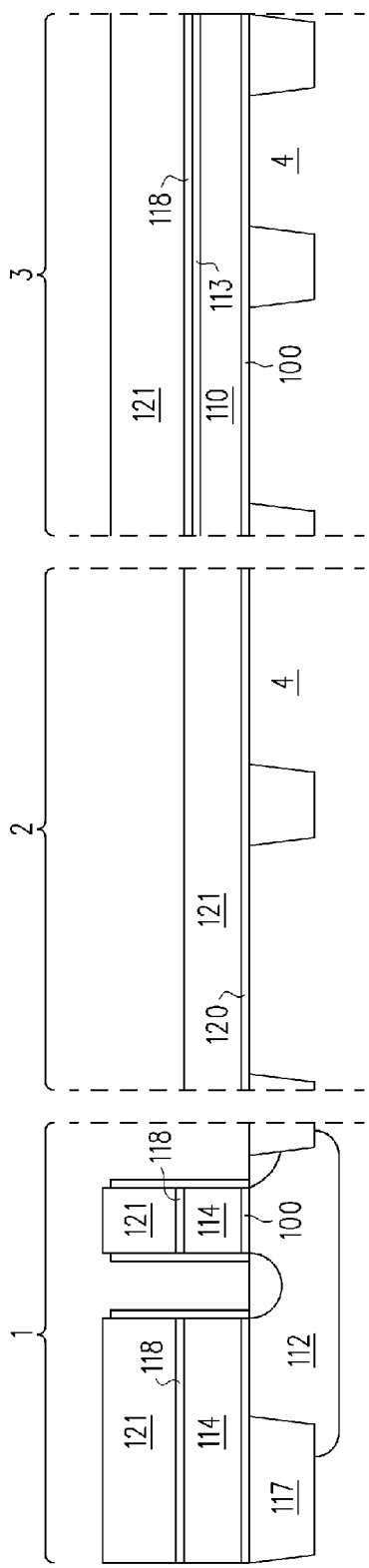

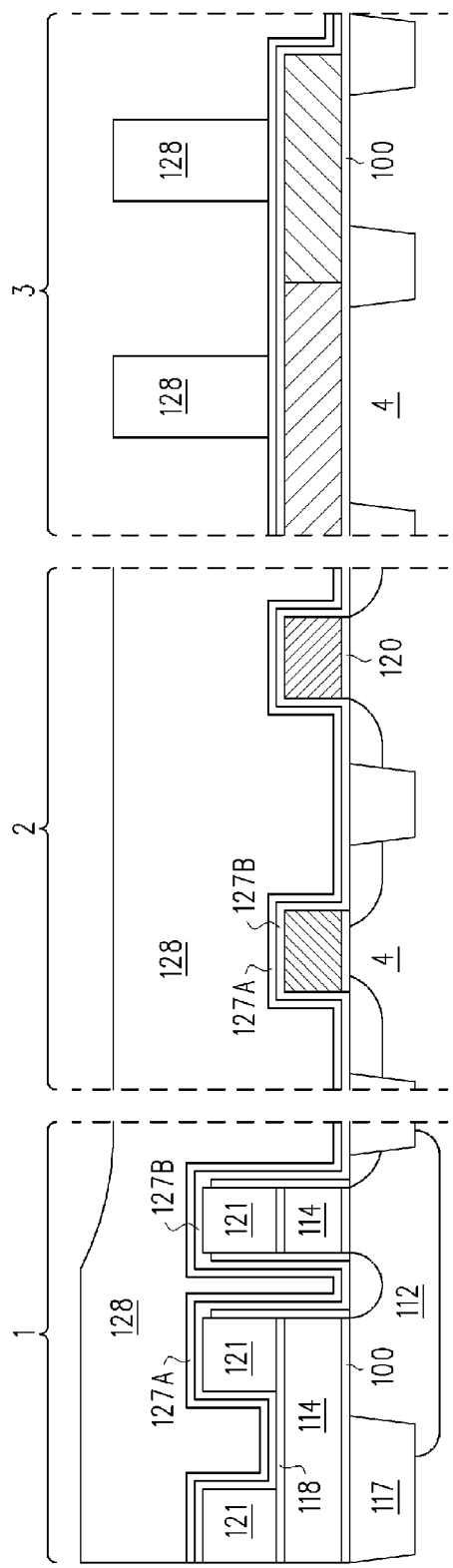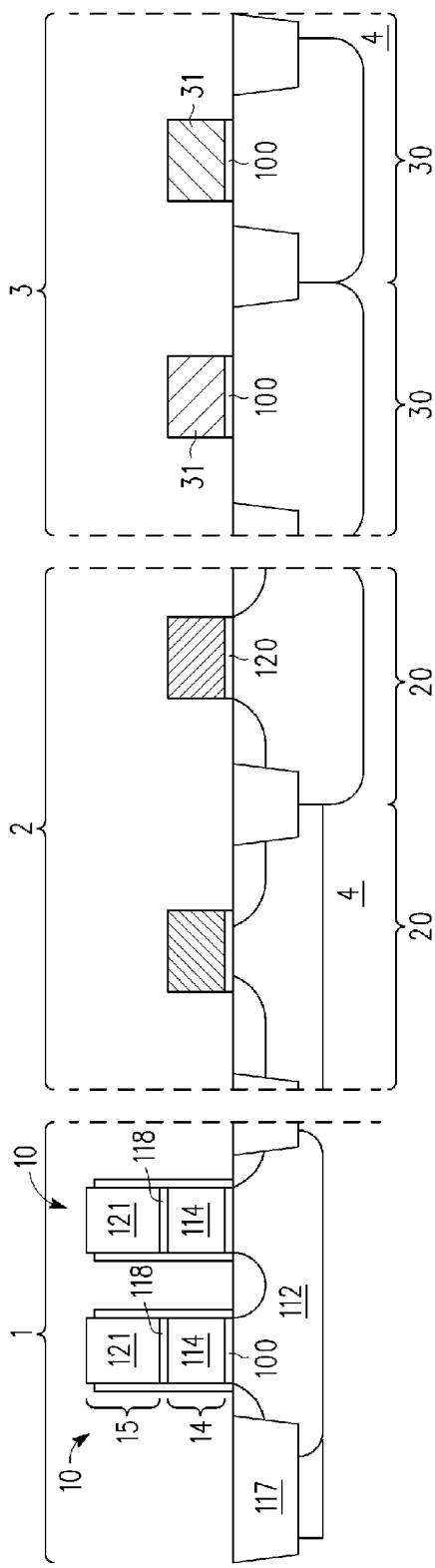

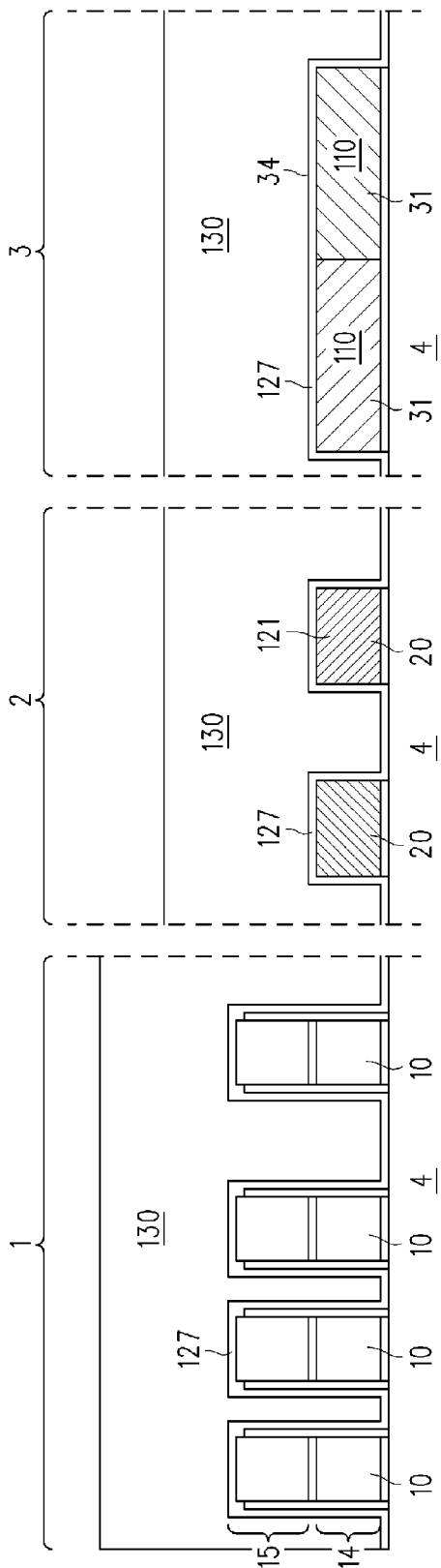
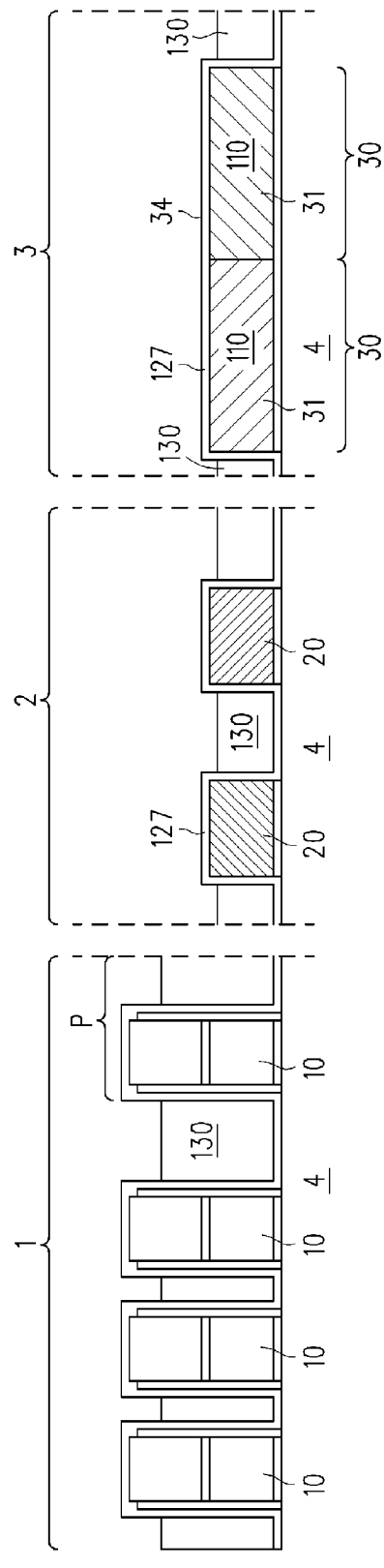
FIG. 2A
FIG. 2B

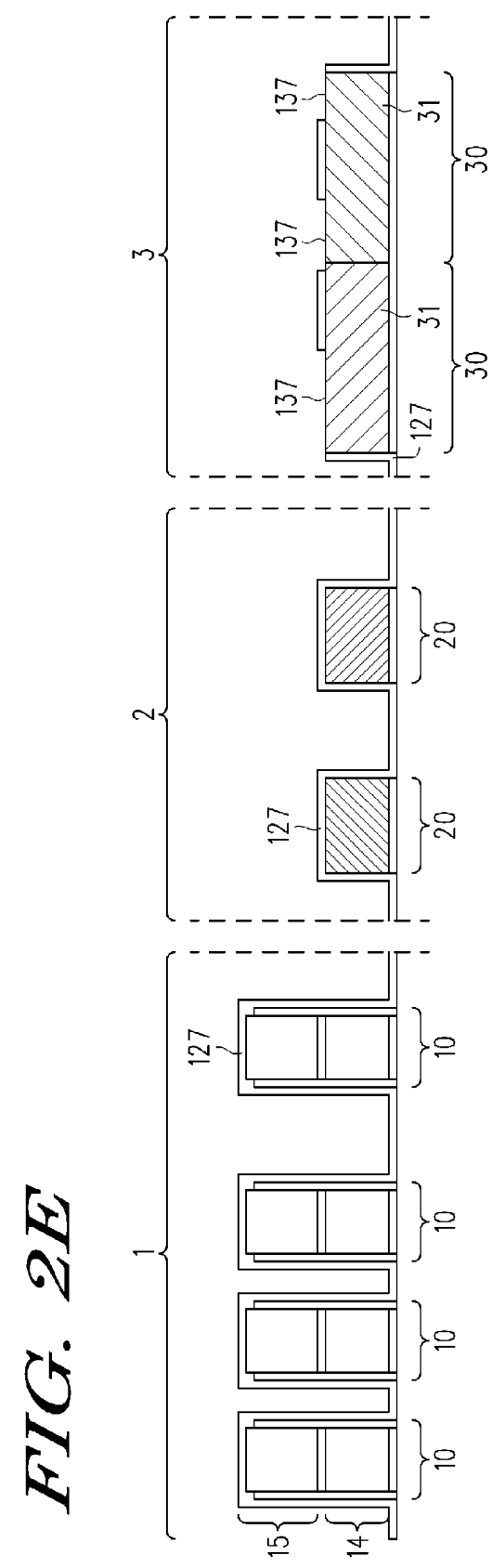

METHOD OF MANUFACTURING A SEMICONDUCTOR DEVICE AND SEMICONDUCTOR DEVICE OBTAINABLE THEREWITH

FIELD OF THE INVENTION

This invention relates to a method of manufacturing a semiconductor device and to a semiconductor device.

BACKGROUND OF THE INVENTION

United states patent application publication US 2005/0185446 describes a method for reducing non-uniformity or topography variation between an array and circuitry in a process for manufacturing semiconductor integrated non-volatile memory devices. This prior art document discloses a method in which an intermediate stack of multiple layers is provided during the manufacturing steps of gates structures in both the memory cell array and peripheral circuitry areas which contain logic circuitry. A thin stack comprising at least a thin dielectric layer and a third conductive layer is provided over a second conductive layer before the step of defining the control gate structures in the array and the single gates in the peripheral circuitry. This intermediate stack of multiple layers is used in order to compensate for thickness differences between the dual gate structures in the array and the single gate transistors in the peripheral circuitry.

However, a disadvantage of the method disclosed in this prior art document is that the intermediate stack requires a large amount of additional processing steps.

SUMMARY OF THE INVENTION

The present invention provides a method of manufacturing a semiconductor device and a semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

FIGS. 1A-J schematically show cross-sectional views of an example of an embodiment of a semiconductor device in different stages of a method of manufacturing non-volatile memory, logic devices and/or high-voltage devices.

FIGS. 2A-E schematically show cross-sectional views of an example of an embodiment of a semiconductor device in different stages of a first example of an embodiment of a method according to the invention.

DETAILED DESCRIPTION OF THE PREFERRED EMBODIMENTS

Figure 1G:
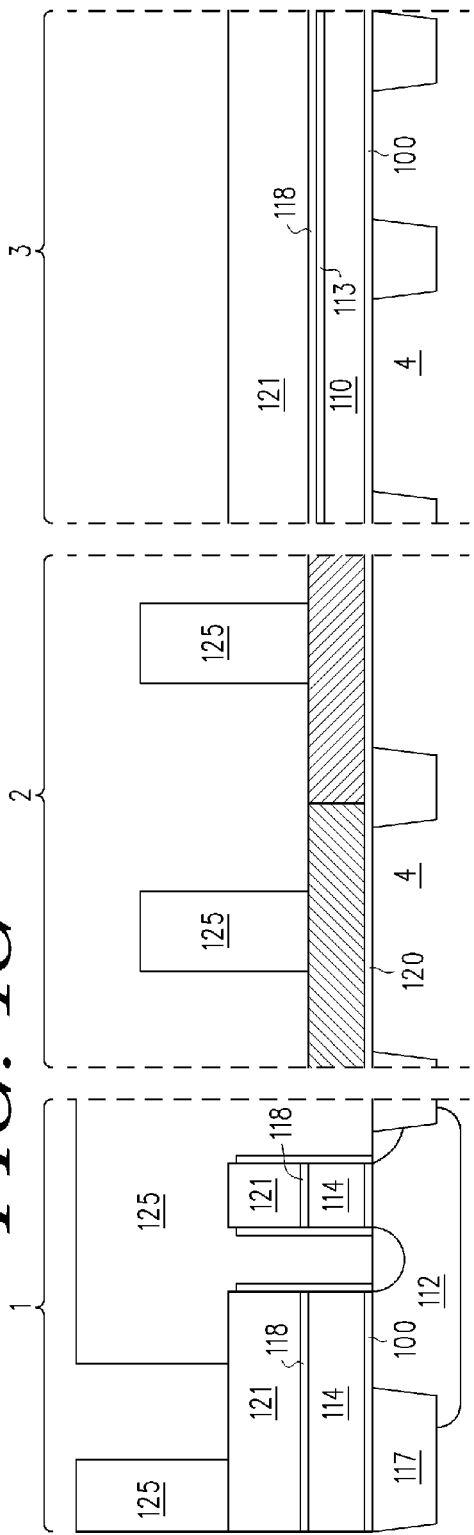

Referring to FIGS. 1-4, examples methods of manufacturing a semiconductor device with both non-volatile memory and logic devices are illustrated therein. In the shown examples, non-volatile memory 10, for example flash memory or Electrically Erasable Programmable Read Only Memory (EEPROM), is formed on a substrate 4. As explained in more detail below, the formation of the non-volatile memory on a substrate may include forming a floating gate structure 14 and a control gate structure 15 in a stacked configuration with the floating gate structure. The method may further include forming logic devices 30 on the substrate. The formation of the logic devices 30 may include forming a logic gate structure. High voltage devices 20 may also be formed, and for example a high voltage gate structure may be formed. Referring to FIG. 1, for example on a common semiconductor substrate 4 respective areas 1-3 for non-volatile memory 10, high-voltage devices 20, and logic devices 30 may be defined. The areas 1-3 may for instance be on different regions a wafer, however the areas 1-3 may also be in the same areas of a wafer.

As illustrated in FIGS. 1A-H, the non-volatile memory 10 and/or the high-voltage devices 20 and/or the logic devices 30 may be manufactured more or less simultaneously. For example, steps of the manufacturing of the non-volatile memory 10 may be performed simultaneously with steps of the manufacturing of or the logic devices 30 and/or the high-voltage devices 20.

As shown in the example of FIG. 1A, one or more active regions 112 may have been formed, for example in the substrate 4, which is to form the channel of a floating gate field effect transistor and/or part of a logic device and/or high voltage devices, for example by providing the substrate with a suitable doping profile.

In the memory area 1 a floating gate structure may be formed on top of the part that will form the channel. For example, an oxide layer may be formed, such as a tunnel oxide layer 113, above the active region 112 in the memory area 1. On top of the (tunnel) oxide layer 113 gate material may be deposited, such as a second polysilicon layer 114.

As shown in FIG. 1A, for instance, a first polysilicon layer 110 or other suitable gate material layer may have been deposited. During the processing the first polysilicon layer 110 is formed into a gate structure 31 e.g. of the logic devices 30, on top of the active regions in the area 1 of the non-volatile memory 10. The first polysilicon layer 110 may for instance be a non patterned layer of uniform thickness that has been deposited in the memory area 1, the high voltage area 2 and the logic area 3. The first polysilicon layer 110 may for example have a thickness of about 0.03 to 0.15 μm.

The deposition of the first polysilicon layer 110 may have been preceded by the formation of a gate oxide layer 100 in areas 1-3. The thickness of the grown gate oxide layer 100 may for example differ over the surface of the substrate 4 and for example, be a thin gate oxide of 65 Å (Angstrom) in the memory area 1 and the high voltage area 2 and have a different thickness in the logic area 3 for different types of logic devices, e.g 25 Å and 65 Å respectively.

As shown in FIG. 1A, the first polysilicon layer 110 may be removed in the memory area 1 and be preserved in the other areas 2,3. The first polysilicon layer 110 may be etched, for example by providing a protective layer 115 on top of a first polysilicon layer 110 in the areas where the first polysilicon layer 110 is to be preserved, such as the logic area 3 and/or the high-voltage area 2 and exposing the first polysilicon layer 110 to an etching medium in area(s) where the first polysilicon layer 110 is to be removed, such as above an active region 112. The gate oxide layer 100 may in the exposed areas, e.g in the memory area 1, act as an etch stop layer which protects the active region 112 against etching.

The protective layer 115 may for example be a photo-resist layer which is deposited, for example by spinning or other suitable technique, on the substrate 4 and first poly silicon layer 110 and patterned using photolithography or other techniques such that the resist is removed above the parts that are to be removed. Following the removal of the first polysilicon layer 110, the protective layer 115 may then be removed in a stripping process using a suitable stripping medium, for example by resolving the layer in a suitable solvent or dry resist stripping medium.

As shown in FIG. 1B, a top surface of the substrate 4 and/or the first polysilicon layer 110 may be oxidized to form the tunnel oxide layer 113 which will act as the gate oxide for the transistors in the memory area 1. The oxide layer may for example have a thickness of less than 10 nm, such as 8.5 nm for example. For instance, in the memory area 1, the top surface of substrate 4 may be oxidised after removal of the first polysilicon layer 110. In the logic area 3 and/or the high-voltage area 2, the top surface of the first polysilicon layer 110 may also be oxidised at the same time to form a oxide layer in those areas 2,3. As shown in FIG. 1B, the second polysilicon layer 114 may be deposited after formation of the oxide layer 113. The second polysilicon layer 114 may for instance be a non patterned layer of uniform thickness, for example of about 0.03 to 0.15 μm, that is been deposited in the memory area 1, the high voltage area 2 and the logic area 3. The second polysilicon layer 114, for instance may be deposited on top of the oxide layer 113. Thus, in the memory area 1 a stack of the substrate 4, oxide layer 113 and the second polysilicon layer 114 is formed. In the regions where the first polysilicon layer 110 remains, e.g. in the logic area 3 and high-voltage area 2, a stack of the substrate 4, the gate oxide layer 100, the first polysilicon layer 110, the oxide layer 113 and the second polysilicon layer 114 is formed.

The second polysilicon layer 114 may be patterned to separate for example the floating gates of different non-volatile memory devices from each other. As shown in FIG. 1B, a patterned resist layer 116 (or other protective layer) may be provided on top of the second polysilicon layer 114, to preserve the second polysilicon layer 114 where desired, such as at the location of the floating gate structures in the memory area 1 and the second polysilicon layer 114 may be removed at the locations not covered by the resist layer 116. Prior to the photo resist layer 116 an Anti reflective coating (ARC) layer may be deposited.

For example, the second polysilicon layer 114 may be etched in an area of a shallow-trench isolation (STI) 117 until the oxide of the STI 117 is reached. Where the second polysilicon layer 114 is not covered by the patterned resist layer 116, such as in the high-voltage area 2 or the logic area 3, the second polysilicon layer 114 may be exposed to a suitable etching medium. In those areas, the second polysilicon layer 114 may for instance be etched until the top surface of the oxide layer 113 is exposed. In these areas 2,3, the oxide layer 113 acts as an etch stop layer in order to protect the first polysilicon layer 110 from etching. The layer 116 may then be removed using a suitable stripping medium, for example by resolving the layer in a suitable solvent or dry resist stripping medium.

As shown in FIG. 1C, an isolating layer may be formed on top of the floating gate electric layer (which in this example is formed by the second polysilicon layer 114), which will separate the floating gate from the control gate in the memory area 1. For example, after removal of the patterned resist layer 116, a stack of Siliconoxide/Siliconnitride/Siliconoxide layers (e.g. SiO2/Si3N4/SiO2), commonly referred to as an Oxide/Nitride/Oxide or ONO layer 118, may be provided where desired, such as in the memory area 1. The ONO layer 118 may for example, be of about 16 nm thickness with e.g. a ratio of thickness of the Oxide/Nitride/Oxide layers being 6:5:5. The ONO layer 118 may for example be deposited in all the areas 1-3 and be etched away where desired such as in the high-voltage area 2. For example, a resist layer 119 or other protective layer may be provided, to preserve the ONO layer 118 where desired and the parts not covered by the resist layer 119 may be exposed to an etching medium. In the shown example, for instance the resist layer 119 is used in at a step that removes the ONO layer 118 and the first poly silicon layer 110 in the High voltage area 2 in order to grow a High voltage oxide.

As illustrated in FIG. 1D, in the high voltage area 2 a high voltage oxide layer 120, e.g. of 25 nm thickness, may be provided. The high voltage oxide layer 120 which may for instance be formed into a high voltage gate dielectric which separates the channel of high-voltage FETs from the gate thereof. The high voltage oxide layer 120 may for example be provided after removal in the high-voltage area 2 of the ONO layer 118, the oxide layer 113 and the first polysilicon layer 110, for example by etching. The oxide layer 100 will act as an etch stop layer. The resist layer 119 may then be removed, for example using a suitable stripping medium.

After forming the floating gate structure, a control gate structure may be provided in a stacked configuration with the floating gate structure. For example, in the parts of the memory area 1 where the control gate structure is to be provided a gate material layer may be provided. For instance, as shown in FIG. 1E, a third polysilicon layer 121 or other suitable gate material layer may be deposited. The third polysilicon layer 121 may for instance have a thickness of 0.03 to 0.15 μm. As shown in FIG. 1E, the third polysilicon layer 121 may be deposited in other areas as well, for example in the high voltage area 2 and the logic area 3.

The polysilicon layer 121 may be patterned in the memory area 1. For example, on top of the third polysilicon layer 121, an amorphous carbon layer 122 and a DARC (Dielectric Anti Reflective Coating) or Antireflective capping layer, such as a Tetra-ethyl-ortho-silicate (TEOS) hard mask layer 123 may be deposited. The amorphous carbon layer 122 may for instance have a thickness of 300 nm. The carbon layer 122 may for instance be deposited by chemical vapor deposition (CVD) of a gas mixture comprising a carbon source. The TEOS layer 123 may for instance have a thickness of 20 nm. The TEOS layer 123 may be covered with a layer of resist 124. The layer of resist 123 may be patterned in desired areas, such as in the memory area 1 in order to expose the TEOS layer 122, the amorphous carbon layer 122, the third polysilicon layer 121, the ONO layer 118 and the second polysilicon layer 114 at those locations to an etching medium. Thereby, for instance, separations between different control gates can be created. As shown in FIG. 1F, the amorphous carbon layer 122 and the TEOS layer 123 may thereafter be removed, for instance using a suitable stripping fluid or using a dry stripping process.

Figure 1H:
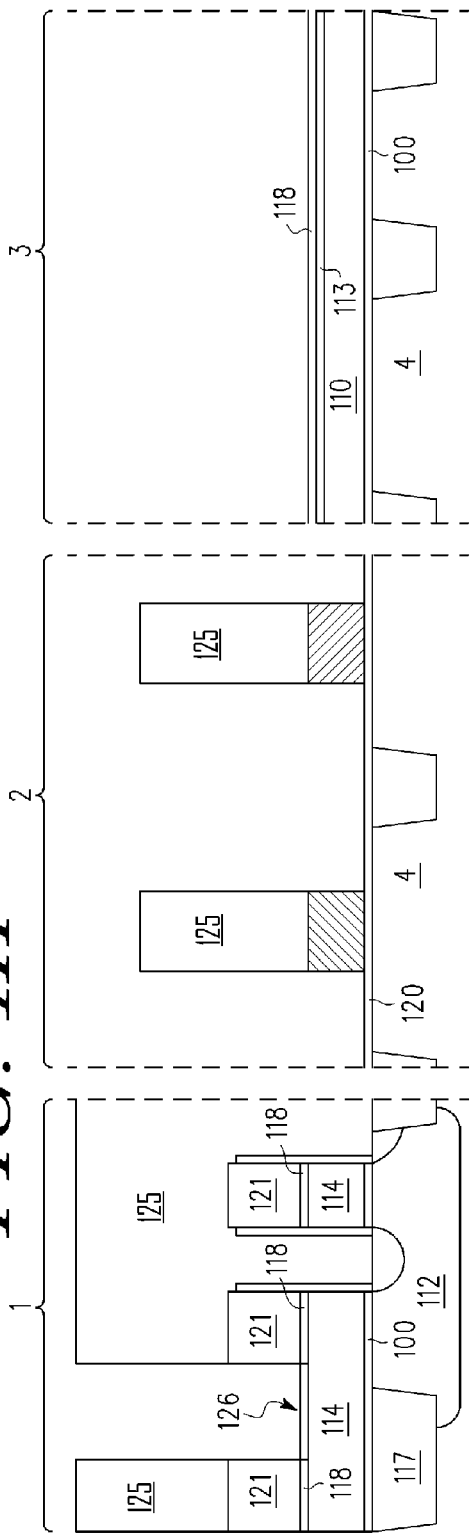

As shown in FIG. 1G, thereafter the third polysilicon layer 121 may be removed in desired areas. For example, in the logic area 3, the third polysilicon layer 121 may be removed entirely, whereas in the high voltage area 2 or the memory area 1 the third polysilicon layer 121 may be removed locally, in order to pattern a structure. For instance, in the high voltage area 2 a high voltage gate structure may be patterned in the third polysilicon layer 121, and in the memory area 1 passages through the polysilicon layer 121 (in order to provide contacts to the second polysilicon layer 114 which forms the floating gate material in this example) may be patterned in the third polysilicon layer 121 (which forms the control gate material in this example). A resist layer 125 may for example be provided on the third polysilicon layer 121 and be patterned, such that the third polysilicon layer 121 is exposed in the areas where the third polysilicon layer 121 is to be removed. As shown in FIG. 1H, for instance in the parts of the memory area 1 where the polysilicon layer 121 is exposed, the polysilicon layer 121 may be etched until the bottom oxide 126 of the ONO layer 118 is exposed. In the high voltage area 2, for instance, the third polysilicon layer 121 may be etched in the parts where it is exposed until the high voltage oxide layer 120 is exposed, to form high voltage gate structures. In the logic area 3, the polysilicon layer 121 may be etched until the bottom oxide 126 of the ONO layer 118 is exposed.

As shown in FIG. 1I, a resist layer 128 or other protective layer may be provided and patterned in the logic area 3 in order to create gate structures for the logic devices. As shown in FIG. 1I, the resist layer 128 may for example be deposited on top of an anti reflective coating (ARC) layer 127A and/or a hard mask layer 127B. The exposed parts, that is those not covered by the resist layer 128, may for example be etched. For instance, in the example of FIG. 1I, the exposed parts of the logic area 3 are etched until the gate oxide layer in order to separate different gate structures from each other in the logic area 3. Thereafter, the resist layer 128, the anti reflective coating (ARC) layer 127A and/or the hard mask layer 127B may be removed, resulting in the gate structures of the logic devices, as shown in FIG. 1J.

Figure 2C:
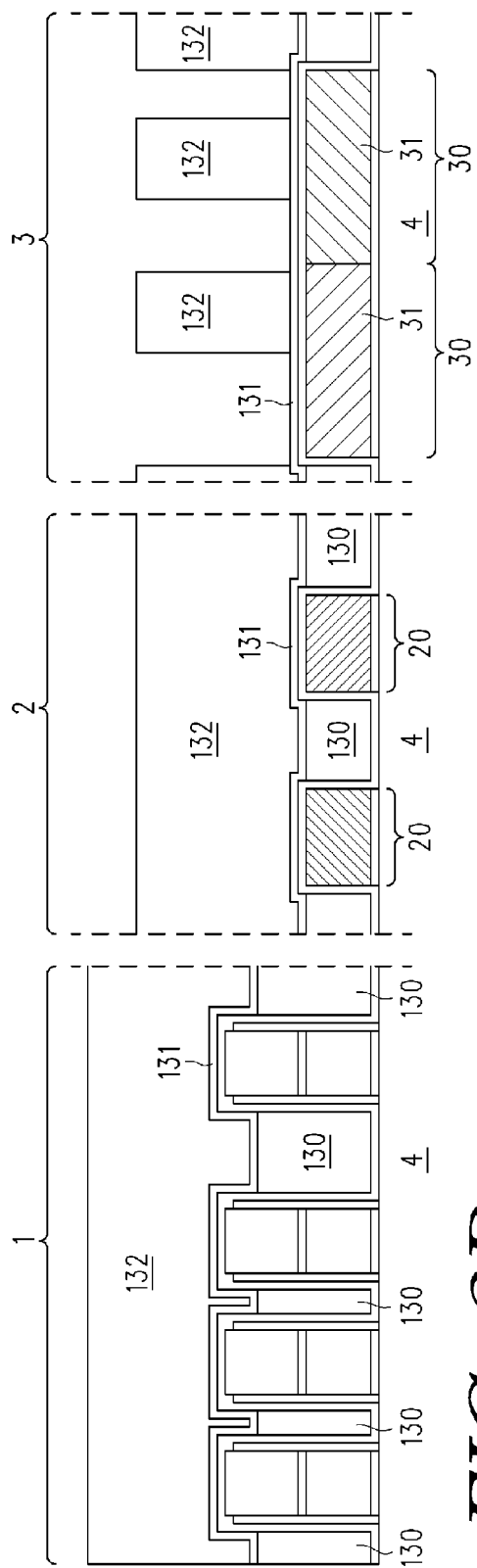
Figure 2D:
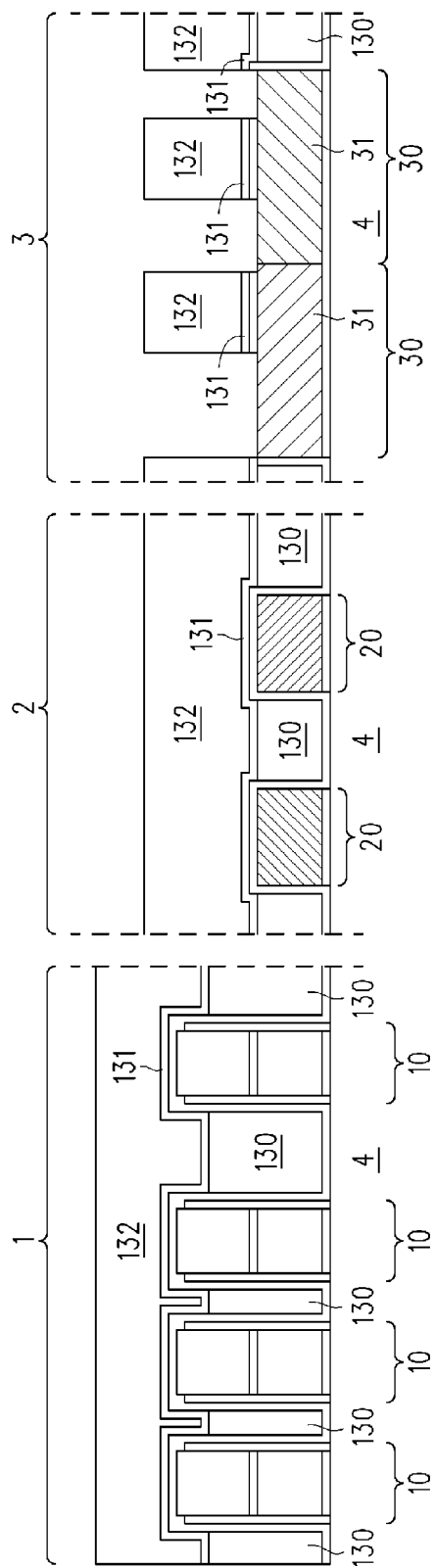
Figure 3A:
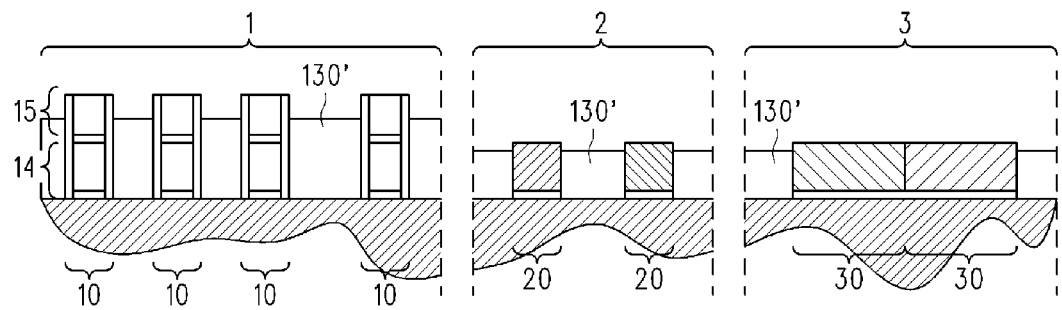
FIGS. 3A-B schematically show cross-sectional views of an example of an embodiment of a semiconductor device in different stages of a second example of an embodiment of a method according to the invention.
Figure 3B:
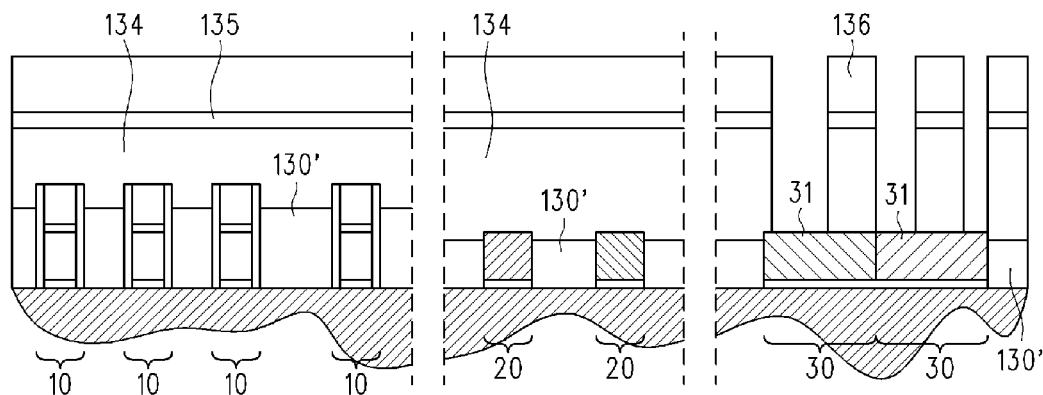
Figure 4:
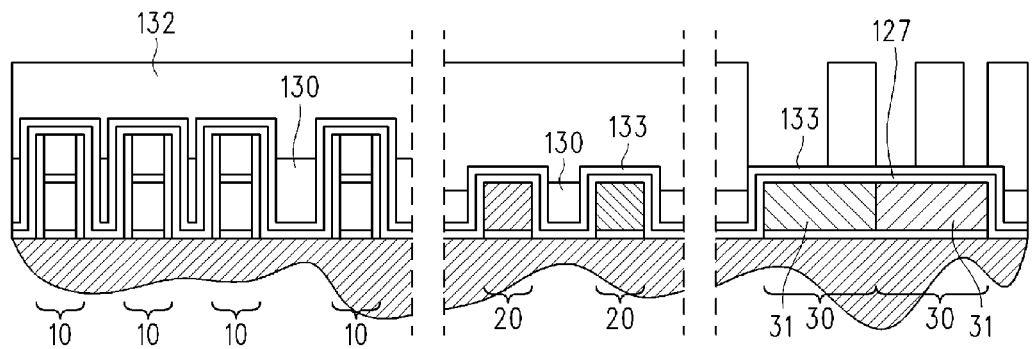
FIG. 4 schematically shows a cross-sectional view of an example of an embodiment of a semiconductor device in a stage of a third example of an embodiment of a method according to the invention.

Referring to FIGS. 2-4, the logic gate structure may for instance be formed by depositing one or more gate material layers and patterning the gate material layers into the logic gate structure 31. The gate material may, as explained with reference to FIGS. 1A-J, for example include a polysilicon layer 110. However, the gate may alternatively be of another type of gate material and/or include two or more material layers.

As shown in FIG. 2A, when the gate material layers have been deposited and the control gate structure 15 is formed, for instance before the resist layer 128 is provided and patterned in the phase illustrated in FIG. 1I, a filling material layer 130 may be deposited over the memory area 1 and the logic area 3 (and if present, over the high voltage area 2). As illustrated in FIG. 2B, the filling material layer 130 may then be partially removed, by reducing the thickness of the filling material layer 130, at least until a top surface 34 of the one or more gate material layers is exposed. Thereby, the non-uniformity of the topography between the memory area 1 and the logic area 3 may be reduced. Accordingly, the risk of damage to the memory devices, for example due to pitting in the peripheral areas P thereof, may be reduced. Furthermore, the filling material can be deposited (and removed) without requiring a complete overhaul of the flow of processing steps.

The filling material layer 130 may be partially removed using a suitable process which selectively removes the desired part of the filling material layer 130 while leaving the stack and the gate material layers intact.

As shown, the filling material has filled the empty spaces in logic area 3 and the high voltage areas 2. Thus, after the partial removal, the difference in height between those spaces and the top of the stack is reduced. In the example of FIG. 2, the thickness of the filling material is reduced more or less uniformly over the substrate, until the top surface 34 is just exposed. Thus, after the partial removal, the high voltage area 2 and the logic area 3 have a very low topology and are more or less flat. Also, the trenches between the stacks in the memory area 1 are filled by the filling material 130 and after the partial removal of the filling layer 130, the difference in height between the trenches and the top of the stacks is reduced as well.

In the example of FIGS. 2A-2E, the filling material layer 130 is deposited on the hard mask layer 127. The hard mask layer 127 may have been deposited over the gate material layer, e.g. the first polysilicon layer 110 in the logic area 3 or the third polysilicon layer 121 in the high voltage area 2, and on the control gate structure 15 in the memory area 1. As shown, the filling material layer 130 may thus cover the stack of the floating gate structure 14 and the control gate structure 15 and cover the gate material layers in the logic area 3.

As shown, the filling material layer 130 may thus be removed above the stack of the floating gate structure 14 and the control gate structure 15 as well as above the gate material layers, while in the memory area 1, a part of the filling material layer 130 remains in the trenches between the stacks and, in the high voltage area 2 and the logic area 3, the spaces adjacent to the gate material layers remain (partially) filled with the filling material layer 130. As shown in FIG. 2B, the remaining thickness of the filling layer in the trenches between stack(s) may exceed the thickness in the spaces next to the gate material layers and for example be smaller than the height of the stacks but larger than the thickness of the gate material layers.

After deposition of the filling material layer 130, the filling material may be subjected to further processing. For example, in order to increase the resistance to post processing, a cure may be performed in order to harden the filling material, for example, to increase the resistance to post processing temperatures.

As shown in the example of FIG. 3A, the top surface 34 may, for example, be the gate material layer (e.g. in this example the first polysilicon layer) 110 itself or, as shown in FIGS. 2 and 4, a layer 127,133 covering the gate material layer 31. The layer covering the gate material layer 110, may for example be a hard mask layer 127, for example a TEOS hard mask or an (inorganic) anti-reflective coating (for example a DARC, Dielectric Anti Reflective Coating) layer 133, as is for instance shown in FIG. 4. The layer covering the gate material layer 110 may for example have been provided before the filling material layer 130 is applied.

After reduction of the filling material layer 130, a logic gate structure 31 may be formed from the gate material layer 110. As shown in FIG. 2C for instance, a photo-resist layer 132 may be deposited on the one or more gate material layers such that the top surface 34 is covered. For example, the photo-resist layer 132 may be applied over the whole wafer area. The photo-resist layer 132 may for example cover the top surface of the memory area 1, the high voltage area 2 and the logic area 3. The photo-resist layer 132 may be patterned in the logic area 3 such that parts of the top surface 34 are exposed, as shown in FIG. 2C.

As shown in FIG. 2C, before depositing the photo-resist layer 132, an anti-reflective coating layer (ARC) 131 may have been deposited. For example, an ARC layer such as a bottom anti-reflective coating (Barc) or a dielectric ARC (DARC) layer may be deposited, for example when no ARC has been deposited before the filling material. The ARC layer 131 may for instance be deposited on the top surface of a remaining part of the filling material layer 130 and on the exposed top surface 34. The ARC layer 131 may be deposited on the top surfaces in the logic area 3 and other parts such as in the memory area 1 and the high voltage area 2.

The photo-resist layer 132 may be patterned such that parts of the top surface 34 in the logic area 3 are exposed and the gate material layer may at least partially be removed in the areas where the top surface is exposed. As for instance shown in FIG. 2D, first layer forming the top surface, in this example the ARC layer 131, and other layers 127 between the top surface 34 and the gate material layer 31 may be removed. For example, the BARC layer 131 and the hard mask layer 127 may be removed at the locations where the top surface 34 is exposed As shown in FIG. 2E, thereafter the filling material layer 130, the ARC layer 131 and the photo-resist layer 132 may be removed. For example, filling material layer 130, the ARC layer 131 and the photo-resist layer 132 may be exposed to suitable stripping media such as a dry resist stripping medium or a suitable solvent liquid.

As illustrated in FIG. 2E, this may result in the gate material being covered by a hard mask layer 127 in the areas that were covered by the photo-resist layer 132. Parts of the gate material in the logic area 3 not covered by the a mask layer 127 may then be exposed to an etching medium, resulting in the gate material being removed in those exposed parts 137 and separate gate structures may thereby be obtained, as has been explained with reference to FIG. 1J. The mask layer 127 may then be removed. For example by exposing the mask layer to suitable stripping media such as a dry resist stripping medium or a suitable solvent liquid.

The filling material layer may be any suitable filling material. The filling material may for example be made of a photo-resist or a dielectric resin, or any kind of spin on dielectric or polymers. For example, photo-resist sensitive to light in the I-line from a mercury-vapour lamp has been found to be a suitable type of photo-resist.

As shown in FIG. 3A, for instance, a dielectric resin layer 130' may be used as a filling material. A suitable dielectric resin has been found to be the dielectric resin traded under the name SiLK by The Dow Chemical Company. As shown in FIG. 3B, after reducing the thickness of the dielectric resin layer 130', a layer 134 of for instance amorphous carbon or other hard mask may be deposited. On top of the amorphous carbon layer 134 a dielectric antireflective coating (DARC) is applied. Referring to FIG. 3B, a photo resist layer 136 may be deposited on top of the DARC layer 135. The photo resist layer 136 may be patterned where desired, for instance in the logic area 3 and subsequently in the parts not covered by the photo resist 136, one or more layers may be etched away. For example, the DARC layer 135 and/or the amorphous carbon layer 134 and/or the gate material layer may be removed. The remaining photo resist 136, DARC 135, amorphous carbon 134 and filling material 130' may then be removed using suitable processing, such as dry resist stripping or using a suitable solvent.

In the foregoing specification, the invention has been described with reference to specific examples of embodiments of the invention. It will, however, be evident that various modifications and changes may be made therein without departing from the broader spirit and scope of the invention as set forth in the appended claims. For example, the semiconductor substrate described herein can be any semiconductor material or combinations of materials, such as gallium arsenide, silicon germanium, silicon-on-insulator (SOI), silicon, monocrystalline silicon, the like, and combinations of the above. Also, instead of patterned photo-resists other protective layers of materials that can be patterned may be used and which protect layers covered by the respective material against, e.g. an etching medium. Furthermore, the protective layers may be patterned using any suitable patterning technique, such as photo-lithography, electron beam lithography or other suitable patterning techniques.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of manufacturing a semiconductor device on a substrate, comprising:
   forming a non-volatile memory in a memory area of said substrate,
   said forming non-volatile memory on a substrate including:
      forming in said memory area a floating gate structure and a control gate structure which is in a stacked configuration with said floating gate structure;
   forming, in a logic area of said substrate, of at least one gate material layer;
   depositing, after said formation of said control gate structure and said gate material layer, over said logic area and said memory area a filling material layer;
   partially removing said filling material layer by reducing in said logic area and said memory area the thickness of said filling material layer, at least until a top surface of said at least one gate material layer is exposed; and
   forming logic devices in said logic area, said forming including forming a logic gate structure from said gate material layer.

2. A method as claimed in claim 1, wherein said forming a logic gate structure from said gate material layer includes:
   depositing a photo-resist layer in said logic area and said memory area;
   patterning said photo-resist layer in said logic area such that parts of said top surface are exposed; and
   at least partially removing said gate material layer where said top surface is exposed.

3. A method as claimed in claim 2, wherein said forming a logic gate from said gate material layer includes, before depositing said photo-resist layer, depositing an anti-reflective coating layer on a remaining part of said filling material layer and on said exposed top surface.

4. A method as claimed in claim 2, including, where said top surface is exposed, removing one or more layers between said gate material layer and said top surface.

5. A method as claimed in claim 1, including: depositing a hard mask on said control gate structure and said at least one layer of a gate material before depositing said filling material layer.

6. A method as claimed in claim 1, wherein said forming a logic gate structure from said gate material layer includes patterning said gate material layer, said method including removing said filling material layer using a suitable fluid after patterning said gate material layer.

7. A method as claimed in claim 6, wherein said filling material layer is made of one or more materials in the group consisting of: photo-resist, dielectric resin, spin on dielectric, organic polymer.

8. A method as claimed in claim 1, wherein said forming a logic gate from said gate material layer includes one or more of:
    depositing an amorphous carbon layer on a remaining part of said filling material layer and on said exposed top surface;
    depositing a dielectric anti-reflective coating layer;
    depositing a photo resist layer.

9. A method as claimed in claim 1, including forming high-voltage devices on said substrate.

10. A method as claimed in claim 3, including, where said top surface is exposed, removing one or more layers between said gate material layer and said top surface.

11. A method as claimed in claim 2, including depositing a hard mask on said control gate structure and said at least one layer of a gate material before depositing said filling material layer.

12. A method as claimed in claim 3, including depositing a hard mask on said control gate structure and said at least one layer of a gate material before depositing said filling material layer.

13. A method as claimed in claim 4, including depositing a hard mask on said control gate structure and said at least one layer of a gate material before depositing said filling material layer.

14. A method as claimed in claim 2, wherein said forming a logic gate structure from said gate material layer includes patterning said gate material layer,
    said method including removing said filling material layer using a suitable fluid after patterning said gate material layer.

15. A method as claimed in claim 3, wherein said forming a logic gate structure from said gate material layer includes patterning said gate material layer,
    said method including removing said filling material layer using a suitable fluid after patterning said gate material layer.

16. A method as claimed in claim 4, wherein said forming a logic gate structure from said gate material layer includes patterning said gate material layer,
    said method including removing said filling material layer using a suitable fluid after patterning said gate material layer.

17. A method as claimed in claim 2, wherein said forming a logic gate from said gate material layer includes one or more of:
    depositing an amorphous carbon layer on a remaining part of said filling material layer and on said exposed top surface;
    depositing a dielectric anti-reflective coating layer;
    depositing a photo resist layer.

18. A method as claimed in claim 3, wherein said forming a logic gate from said gate material layer includes one or more of:
    depositing an amorphous carbon layer on a remaining part of said filling material layer and on said exposed top surface;
    depositing a dielectric anti-reflective coating layer;
    depositing a photo resist layer.

19. A method as claimed in claim 4, wherein said forming a logic gate from said gate material layer includes one or more of:
    depositing an amorphous carbon layer on a remaining part of said filling material layer and on said exposed top surface;
    depositing a dielectric anti-reflective coating layer;
    depositing a photo resist layer.

20. A method as claimed in claim 5, wherein said forming a logic gate from said gate material layer includes one or more of:
    depositing an amorphous carbon layer on a remaining part of said filling material layer and on said exposed top surface;
    depositing a dielectric anti-reflective coating layer;
    depositing a photo resist layer.

* * * * *